(12) United States Patent
Kim et al.

(10) Patent No.: US 12,382,580 B2
(45) Date of Patent: Aug. 5, 2025

(54) PRINTED CIRCUIT BOARD, PRINTED CIRCUIT BOARD WITH CARRIER AND METHOD FOR MANUFACTURING PRINTED CIRCUIT BOARD PACKAGE

(71) Applicant: SAMSUNG ELECTRO-MECHANICS CO., LTD., Suwon-si (KR)

(72) Inventors: Jung Han Kim, Suwon-si (KR); Youn Gyu Han, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/746,372

(22) Filed: May 17, 2022

(65) Prior Publication Data
US 2023/0209707 A1 Jun. 29, 2023

(30) Foreign Application Priority Data

Dec. 24, 2021 (KR) .......................... 10-2021-0187673

(51) Int. Cl.
*H05K 1/02* (2006.01)
*H05K 1/11* (2006.01)
(52) U.S. Cl.
CPC ......... *H05K 1/0298* (2013.01); *H05K 1/0271* (2013.01); *H05K 1/115* (2013.01);
(Continued)
(58) Field of Classification Search
CPC .... H05K 1/0298; H05K 1/0271; H05K 1/115; H05K 3/10; H05K 3/30; H05K 2201/09827; H05K 2201/2081; H05K 1/185; H05K 2201/068; H05K 2203/016; H05K 3/4682; H05K 1/111; H05K 1/0313; H05K 3/007; H05K 2203/0147; H05K 2201/0152; H05K 2203/0156;
(Continued)

(56) References Cited

U.S. PATENT DOCUMENTS

2009/0095514 A1* 4/2009 Kaneko .................. H05K 3/381
174/250
2009/0096095 A1* 4/2009 Ishido .................. H01L 25/105
257/E21.511
(Continued)

FOREIGN PATENT DOCUMENTS

JP 2015-204454 A 11/2015
JP 2016-048768 A 4/2016
(Continued)

*Primary Examiner* — Steven T Sawyer
(74) *Attorney, Agent, or Firm* — Morgan, Lewis & Bockius LLP (57) ABSTRACT

A printed circuit board includes: a plurality of insulating layers; a plurality of wiring pattern layers disposed on at least one surface of the plurality of insulating layers; a via connecting wiring pattern layers, among the plurality of wiring pattern layers, disposed on upper and lower surfaces of one of the plurality of insulating layers to each other; a connection pad disposed on a surface of an outermost layer among the plurality of insulating layers; and a solder resist having a hole exposing at least a portion of the connection pad. An external surface of the solder resist has surface roughness.

17 Claims, 6 Drawing Sheets

(52) U.S. Cl.
CPC .............. *H05K 2201/09827* (2013.01); *H05K 2201/2081* (2013.01)

(58) Field of Classification Search
CPC ........... H01L 21/4857; H01L 23/49894; H01L 23/49822; H01L 24/81; H01L 23/12
See application file for complete search history.

(56) References Cited

U.S. PATENT DOCUMENTS

| | | | | |
|---|---|---|---|---|
| 2009/0293269 A1* | 12/2009 | Dai | ...................... | H05K 3/3452 29/829 |
| 2012/0119358 A1* | 5/2012 | Oh | ...................... | H01L 23/3142 257/737 |
| 2013/0203219 A1* | 8/2013 | Park | ...................... | H01L 21/563 438/126 |
| 2014/0076614 A1* | 3/2014 | Kobayashi | ........... | H05K 1/0298 174/251 |
| 2014/0102767 A1* | 4/2014 | Kang | .................. | H05K 1/0298 216/13 |
| 2014/0185254 A1* | 7/2014 | Mok | ...................... | H01L 21/563 174/250 |
| 2014/0209361 A1* | 7/2014 | Nakai | .................. | H05K 1/115 174/257 |
| 2015/0250054 A1* | 9/2015 | Yoshikawa | ........... | H01L 25/105 361/767 |
| 2015/0296618 A1 | 10/2015 | Huang et al. | | |
| 2016/0021744 A1 | 1/2016 | Baek et al. | | |
| 2016/0064319 A1* | 3/2016 | Suzuki | .............. | H01L 23/49822 174/251 |
| 2017/0064841 A1* | 3/2017 | Han | ...................... | H05K 3/4682 |
| 2017/0196084 A1* | 7/2017 | Ishihara | ................. | H05K 3/429 |
| 2017/0317017 A1* | 11/2017 | Ishihara | ........... | H01L 23/49827 |
| 2018/0027664 A1* | 1/2018 | Ikawa | .................. | H05K 3/3452 174/256 |
| 2022/0046806 A1* | 2/2022 | Kawai | ...................... | C25D 5/56 |
| 2023/0089948 A1* | 3/2023 | Kasuga | ................. | H05K 1/115 174/261 |
| 2023/0247769 A1* | 8/2023 | Han | ........................ | H05K 3/28 174/250 |

FOREIGN PATENT DOCUMENTS

| | | |
|---|---|---|
| KR | 10-2013-0048061 A | 5/2013 |
| KR | 10-2015-0033912 A | 4/2015 |
| KR | 10-2016-0010960 A | 1/2016 |
| KR | 10-2016-0023463 A | 3/2016 |
| KR | 10-2021-0016599 A | 2/2021 |

* cited by examiner

PRINTED CIRCUIT BOARD, PRINTED CIRCUIT BOARD WITH CARRIER AND METHOD FOR MANUFACTURING PRINTED CIRCUIT BOARD PACKAGE

CROSS-REFERENCE TO RELATED APPLICATION(S)

This application claims benefit of priority to Korean Patent Application No. 10-2021-0187673 filed on Dec. 24, 2021 in the Korean Intellectual Property Office, the disclosure of which is incorporated herein by reference in its entirety.

TECHNICAL FIELD

The present disclosure relates to a printed circuit board and a method for manufacturing the same.

BACKGROUND

In accordance with rapid progress in the miniaturization and multi-functionality of a small terminal electronic product such as a mobile device, a thin and high-performance access point (AP) chip or memory chip may be required, and a printed circuit board technology for packaging the same may thus be required.

An attempt has recently been made in which a thin board having a thickness of 80 μm or less is developed, thereby reducing an overall thickness of a chip-mounted package. However, most board makers or semiconductor packaging companies do not have a process facility suitable for handling such a thin board having a thickness of 80 μm or less. In addition, when made thinner, the board may be easily broken during a process because a material of the board remains rigid.

The board may be made thin. However, when the board is made thin by using a rigid material, it is difficult to handle the board due to its high brittleness.

SUMMARY

An aspect of the present disclosure may provide a printed circuit board which may overcome problems that may occur in a semiconductor chip packaging process by using a thin printed circuit board.

Another aspect of the present disclosure may provide a printed circuit board with a carrier in which the printed circuit board is fixed to the carrier used in a semiconductor chip packaging process without using an adhesive.

Another aspect of the present disclosure may provide a method for manufacturing a printed circuit board package, the method being capable of stably packaging a semiconductor chip, even using a thin printed circuit board.

According to an aspect of the present disclosure, a printed circuit board may include: a plurality of insulating layers; a plurality of wiring pattern layers disposed on at least one surface of the plurality of insulating layers; a via connecting wiring pattern layers, among the plurality of wiring pattern layers, disposed on upper and lower surfaces of one of the plurality of insulating layers to each other; a connection pad disposed on a surface of an outermost layer among the plurality of insulating layers; and a solder resist having a hole exposing at least a portion of the connection pad. An external surface of the solder resist may have surface roughness.

According to another aspect of the present disclosure, a printed circuit board with a carrier may include: a printed circuit board layer including a plurality of insulating layers and a plurality of wiring pattern layers stacked on each other; a via connecting wiring pattern layers, among the plurality of wiring pattern layers, disposed on upper and lower surfaces of one of the plurality of insulating layers to each other; a connection pad disposed on a surface of an outermost layer among the plurality of insulating layers; and a solder resist having a hole exposing at least a portion of the connection pad; and a carrier substrate on an outermost layer on which a metal foil portion in contact with the solder resist is disposed. A surface of the metal foil portion and a surface of the solder resist that are in contact with each other may have surface roughness complementary with each other.

According to another aspect of the present disclosure, a method for manufacturing a printed circuit board package may include: forming a printed circuit board layer; forming first and second solder resist layers on upper and lower surfaces of the printed circuit board layer, respectively, and forming a hole in the first solder resist layer to expose a first connection pad of the printed circuit board layer and a hole in the second solder resist layer to expose a second connection pad of the printed circuit board layer; attaching a carrier, on an outermost layer on which a metal foil portion that has surface roughness is formed, to an external surface of the second solder resist layer having an adjusted curing degree by adjusting the curing degree of the second solder resist layer; mounting and molding a semiconductor chip on the first connection pad; separating a board on which the semiconductor chip is mounted from the carrier; and exposing the second solder resist layer and the second connection pad by etching the metal foil portion exposed from the separated board. The surface roughness of the metal foil portion may be transferred to the external surface of the second solder resist layer.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

The embodiments of the present disclosure may be modified into other forms and are provided so that this disclosure will be thorough and complete and will fully convey the scope of the invention to those of ordinary skill in the art. In the drawings, the shapes and dimensions of elements may be exaggerated for clarity, and like reference numerals denote like elements.

In the present disclosure, the meaning of a "connection" of a component to another component includes an indirect connection through another element as well as a direct connection between two components. In addition, in some cases, the meaning of "connection" includes all "electrical connections".

It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The terms used in the present disclosure are used to simply describe an example and are not intended to limit the present disclosure. A singular term includes a plural form unless otherwise indicated.

Hereinafter, the present disclosure will be described with reference to the accompanying drawings. In the drawings, the shapes and dimensions may be exaggerated or reduced for clarity.

Hereinafter, exemplary embodiments of the present disclosure will now be described in detail with reference to the accompanying drawings.

Electronic Device System

Figure 1:
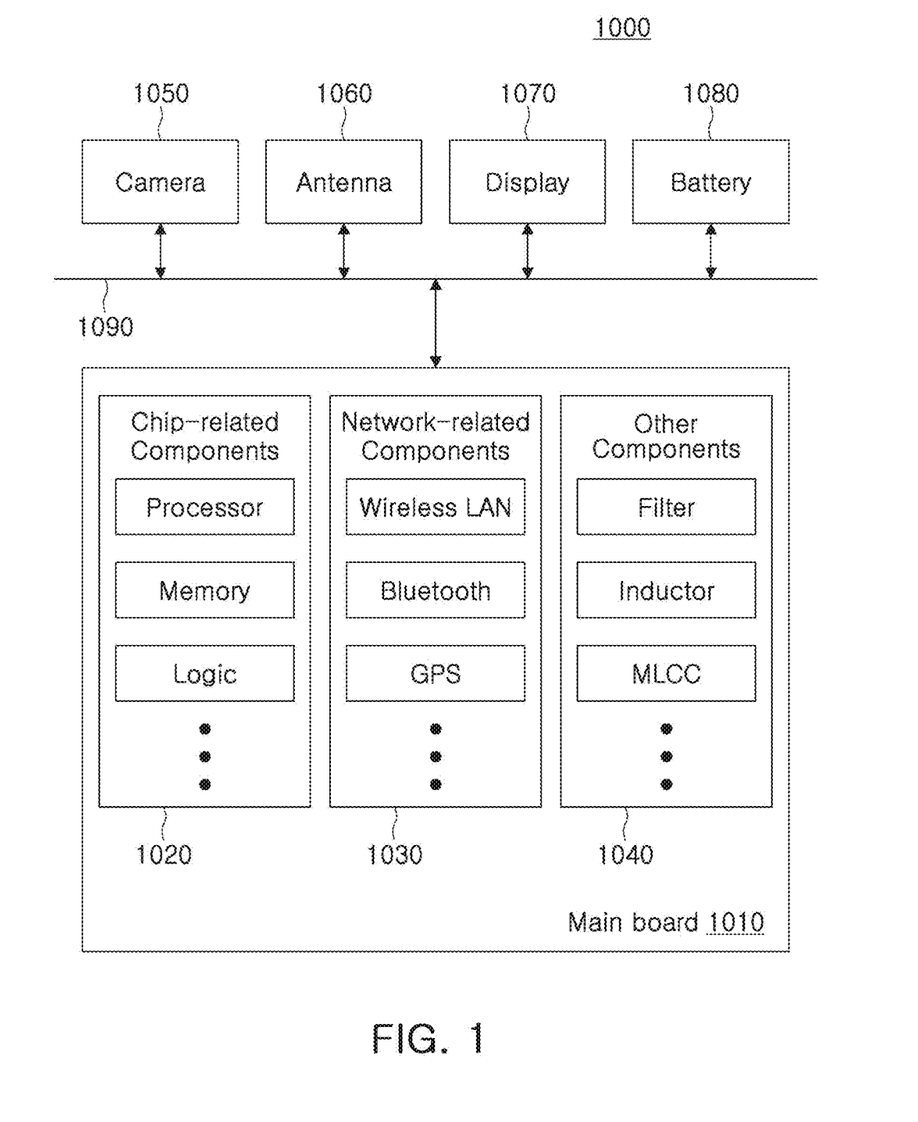
FIG. 1 is a schematic block diagram illustrating an example of an electronic device system.

FIG. 1 is a schematic block diagram illustrating an example of an electronic device system.

Referring to the drawings, an electronic device 1000 may accommodate a main board 1010. The main board 1010 may include chip-related components 1020, network-related components 1030, other components 1040 and the like, which are physically or electrically connected thereto. These components may be connected to others described below to form various signal lines 1090.

The chip-related components 1020 may be a memory chip such as a volatile memory (e.g., a dynamic random access memory (DRAM)), a non-volatile memory (e.g., a read only memory (ROM)), a flash memory or the like; an application processor chip such as a central processor (e.g., a central processing unit (CPU)), a graphics processor (e.g., a graphics processing unit (GPU)), a digital signal processor, a cryptographic processor, a microprocessor, a microcontroller or the like; and a logic chip such as an analog-to-digital converter (ADC), an application-specific IC (ASIC) or the like. However, the chip-related components 1020 are not limited thereto, and may further include another type of chip-related components in addition to these chips. In addition, these chip-related components may be combined with each other. The chip-related components 1020 may be a package including the above-described chips.

The network-related components 1030 may include protocols such as wireless fidelity (Wi-Fi) (Institute of Electrical And Electronics Engineers (IEEE) 802.11 family or the like), worldwide interoperability for microwave access (WiMAX) (IEEE 802.16 family or the like), IEEE 802.20, longterm evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network-related components 1030 are not limited thereto, and may also include a variety of other wireless or wired standards or protocols. In addition, the network-related components 1030 may be combined with the chip-related components 1020, and provided in a package.

The other components 1040 may include a high frequency inductor, a ferrite inductor, a power inductor, ferrite beads, low temperature co-fired ceramics (LTCC), an electromagnetic interference (EMI) filter, a multilayer ceramic condenser (MLCC) and the like. However, the other components 1040 are not limited thereto, and may further include a passive element in a form of a chip component used for various other purposes in addition to these components. In addition, the other components 1040 may be combined with the chip-related components 1020 and/or the network-related components 1030, and provided in a package.

The electronic device 1000 may include another electronic component that may be or may not be physically or electrically connected to the main board 1010, based on a type of the electronic device 1000. Another electronic component may be a camera module 1050, an antenna module 1060, a display 1070, a battery 1080, etc. However, another electronic component is not limited thereto, and may be an audio codec, a video codec, a power amplifier, a compass, an accelerometer, a gyroscope, a speaker, a mass storage device (e.g., a hard disk drive), a compact disk (CD), a digital versatile disk (DVD), etc. In addition, another electronic component may be another electronic component used for various purposes, based on the type of the electronic device 1000.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive component or the like. However, the electronic device 1000 is not limited thereto, and may be any other electronic device that processes data.

Figure 2:
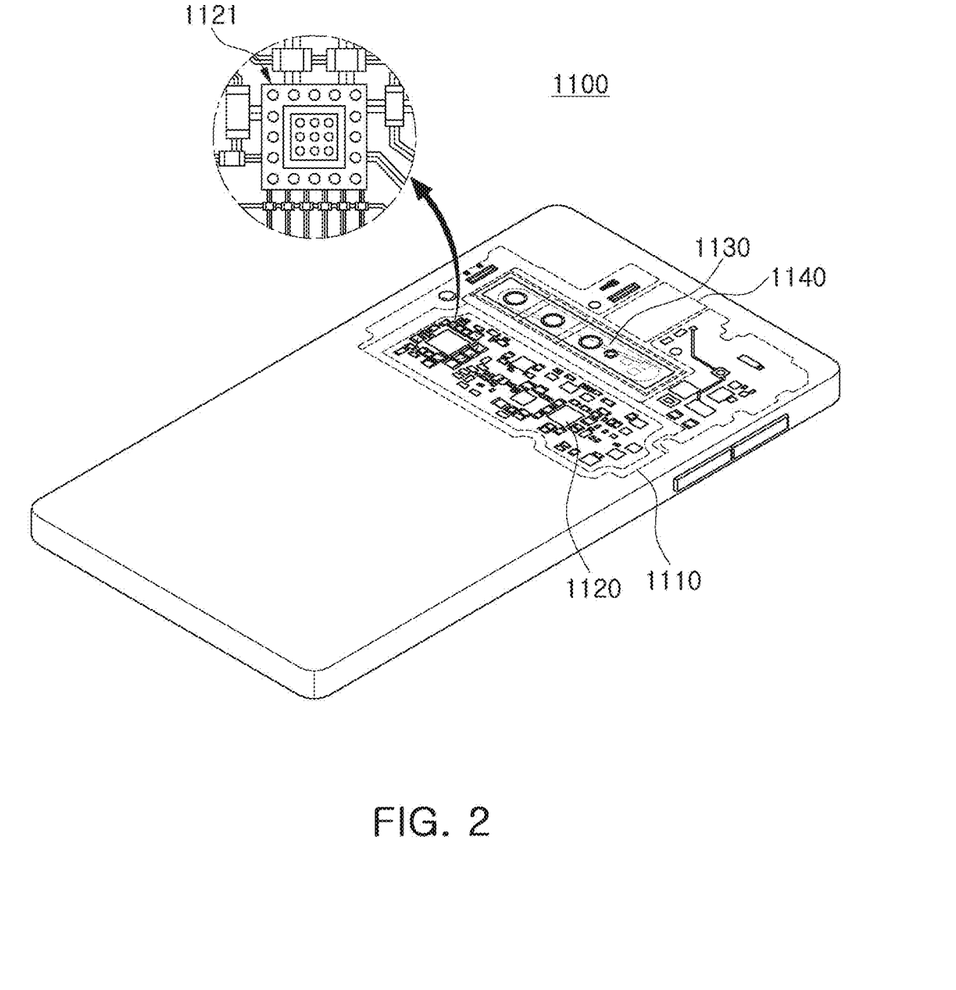
FIG. 2 is a perspective view schematically illustrating an example of an electronic device.

FIG. 2 is a perspective view schematically illustrating an example of an electronic device.

Referring to FIG. 2, the electronic device may be, for example, a smartphone 1100. The smartphone 1100A may accommodate a mother board 1110, and various electronic components 1120 may be physically or electrically connected to the motherboard 1110. The smartphone 1100A may also accommodate a camera module 1130 and/or a speaker 1140. One of the electronic components 1120 may be the chip-related component described above, for example, a bridge-embedded board 1121 on a surface of which a plurality of electronic components are mounted, and is not limited thereto. Meanwhile, the electronic device is not necessarily limited to the smartphone 1100, and may be another electronic device as described above.

Printed Circuit Board

Figure 3:
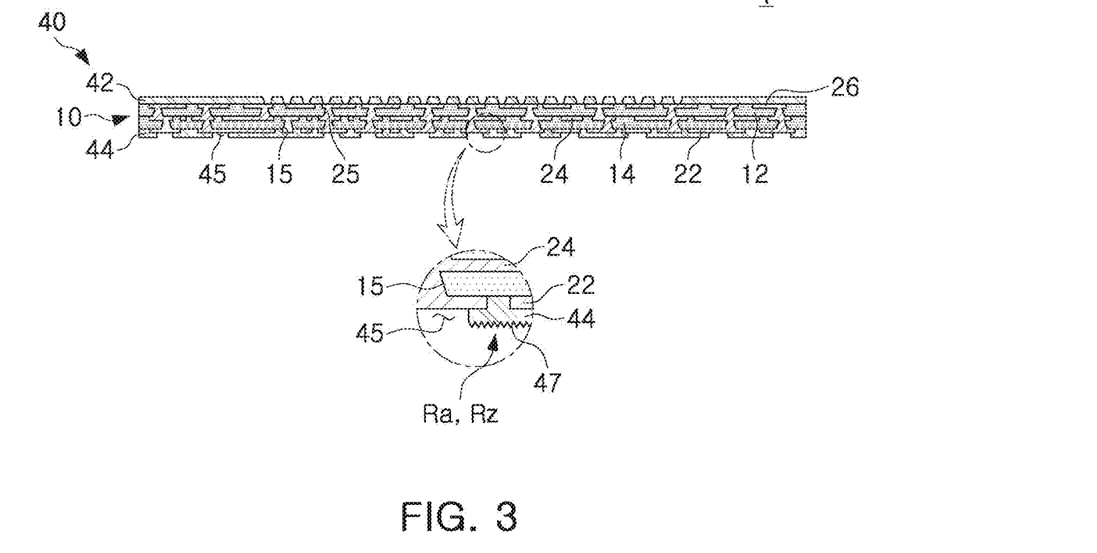
FIG. 3 is a cross-sectional view schematically illustrating a cross-section of a printed circuit board according to an exemplary embodiment of the present disclosure.

FIG. 3 is a cross-sectional view schematically illustrating a cross-section of a printed circuit board according to an exemplary embodiment of the present disclosure.

Referring to FIG. 3, a printed circuit board 1 according to an exemplary embodiment of the present disclosure may include a printed circuit board layer 10, vias 15 and 25, connection pads 22 and 26 and a solder resist 40.

The printed circuit board layer 10 may include a plurality of insulating layers 12 and 14 and a plurality of wiring pattern layers 22, 24 and 26, and the plurality of insulating layers 12 and 14 and the plurality of wiring pattern layers 22, 24 and 26 may be repeatedly stacked on each other as needed. In an exemplary embodiment of FIG. 3, the insulating layers 12 and 14 may be two layers, and the wiring pattern layers 22, 24 and 26 may be three layers. The plurality of the insulating layers and the plurality of the wiring pattern layers may be built up, and the printed circuit board layer 10 may have a total thickness of 80 μm or less to maintain the printed circuit board made thin. Conventional semiconductor packaging process facilities are optimized for the printed circuit board layer 10 having a total thickness greater than 80 μm. Accordingly, in general, these facilities are not suitable for the printed circuit board layer 10 having the total thickness of 80 μm or less. However, the thin printed circuit board may be used with a carrier attached to the board having the total thickness of 80 μm or less as in another exemplary embodiment of the present disclosure. In this case, it is possible to solve problems such as damage or warpage of the board, occurring during its transfer even though the thin printed circuit board is manufactured in the conventional semiconductor packaging process facility by using a method for manufacturing a semiconductor packaging, proposed in yet another exemplary embodiment of the present disclosure.

The insulating layers 12 and 14 may each be formed of an insulating material including a glass fabric or an insulating resin including no glass fabric. Prepreg (PPG) may be used as the typical insulating material including a glass fabric, and an Ajinomoto build-up film (ABF) or the like may be used as the insulating resin including no glass fabric. The insulating material is not particularly limited.

In addition, the insulating layers 12 and 14 may each be an organic insulating layer including at least one of the Ajinomoto build-up film (ABF) and polyimide, and is not limited thereto.

The wiring pattern layers 22, 24 and 26 formed on upper and lower surfaces of the insulating layers 12 and 14 may be connected to each other through the vias 15 and 25.

The multilayer vias 15 and 25 may use a metal material, and the metal material may be copper (Cu), aluminum (Al), silver (Ag), tin (Sn), gold (Au), nickel (Ni), lead (Pb), titanium (Ti) or an alloy thereof. The multilayer vias 15 and 25 may be signal connection vias, ground connection vias, power connection vias or the like, based on a design. Each wiring via of the multilayer vias 15 and 25 may be completely filled with the metal material, or may be the metal material formed along a wall surface of a via hole. The multilayer vias 15 and 25 may each have a tapered shape, and each be formed by a plating process, for example, additive process (AP), semi-additive process (SAP), modified semi-additive process (MSAP), tenting (TT) process or the like. As a result, the multilayer vias 15 and 25 may each include a seed layer, which is an electroless plating layer, and an electrolytic plating layer formed based on the seed layer. The number of the multilayer vias 15 and 25 may be more or less than illustrated in the drawing.

The connection pad 22 or 26 may be the wiring pattern layer formed on an outermost layer of the printed circuit board layer 10 and externally exposed among the wiring pattern layers 22, 24 and 26. The connection pad 22 or 26 may be connected to an external semiconductor chip or another board.

The wiring pattern layer 22, 24 or 26 may be a conductive metal layer formed by electroplating, chemical plating or sputtering, and the wiring pattern layer 22, 24 or 26 may be a metal layer of copper (Cu), aluminum (Al), silver (Ag), tin (Sn), gold (Au), nickel (Ni), lead (Pb), titanium (Ti) or an alloy thereof.

The solder resist 40 may be positioned on the outermost layer of the printed circuit board layer 10 to prevent reflow of a solder when connected to an external electronic component. The solder resist 40 may include a hole 45 externally exposing the connection pad 22 or 26.

An external surface of a solder resist 44 which is one of the solder resists 40 may have a roughness surface 47, on which roughness is formed. In one example, the surface roughness of the external surface 47 of the solder resist 44 may be greater than surface roughness of an internal surface of the solder resist layer 44 in contact with an outermost layer among the plurality of insulating layers 12 and 14.

Here, the roughness surface 47 of the solder resist 40 may have an arithmetic average surface roughness (center-line average roughness) Ra of 0.12 to 0.2 μm and a ten (10)-point average surface roughness Rz of 0.6 to 1.3 μm.

The solder resist 40 may be formed of a photosensitive material or a thermosetting material, and may be made by, for example, stacking film-shaped resist materials on each other or screen-printing an ink-type resist material.

FIGS. 4a through 4f are cross-sectional views respectively illustrating a method for manufacturing the printed circuit board of FIG. 3.

Figure 4A:
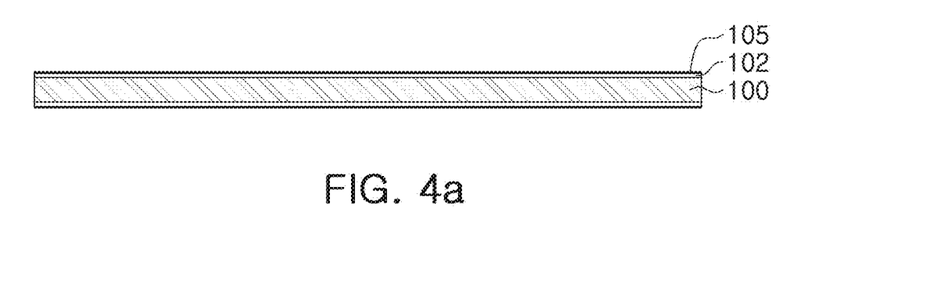
FIGS. 4a through 4f are cross-sectional views respectively illustrating a method for manufacturing the printed circuit board of FIG. 3.

FIG. 4a is a cross-sectional view that a first carrier 100 is positioned on the printed circuit board. The carrier may indicate a structure which may transfer the board, and the carrier 100 may include a detachable copper foil (DCF) substrate including a commercially available micro-copper foil which is detachable and an insulating material or a rigid structure having a silicon or glass wafer surface including a deformable metal. The carrier 100 may include a bonding layer 102 and a copper foil layer 105 serving as a seed layer for forming the wiring pattern layer. The copper foil layer 105 may be a conductive metal foil portion.

Figure 4B:
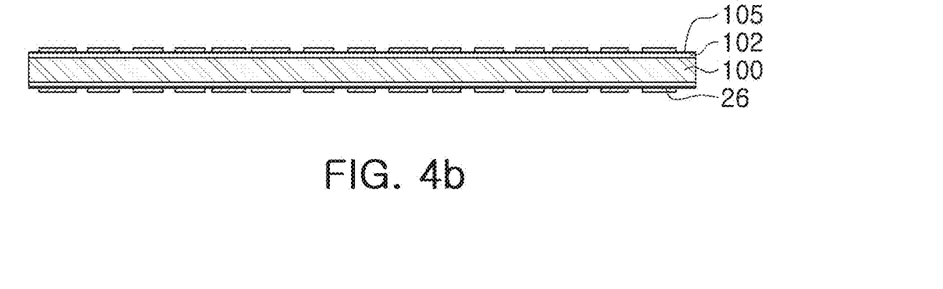
Figure 4C:
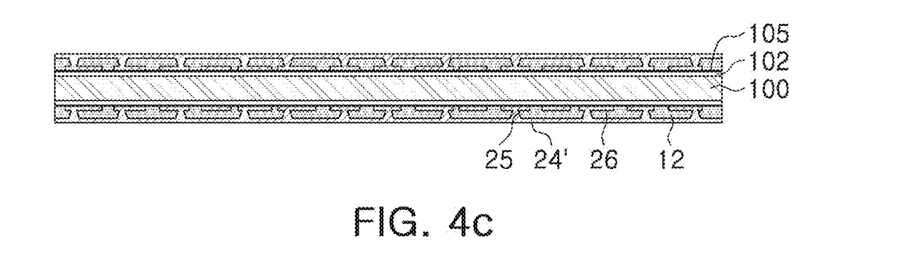

FIG. 4b is a cross-sectional view illustrating that the wiring pattern layer serving as the outermost connection pad 26 is formed, and FIG. 4c is a cross-sectional view illustrating a process of building up the insulating layer 12 and a wiring pattern layer 24'.

Formed here is the via 25 connecting the connection pad 26 and the wiring pattern layer 24' to each other.

Figure 4D:
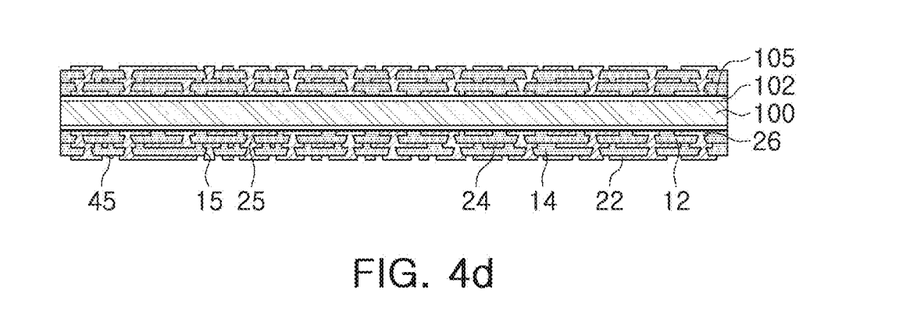

FIG. 4d is a cross-sectional view illustrating that the insulating layer 14 and the wiring pattern layer serving as the outermost connection pad 22. The wiring pattern layer 24' may be processed into the designed wiring pattern layer 24, the insulating layer 14 may then be stacked thereon, and the via 15 connecting the wiring pattern layer 24 and the outermost connection pad 22 to each other may be formed.

Figure 4E:
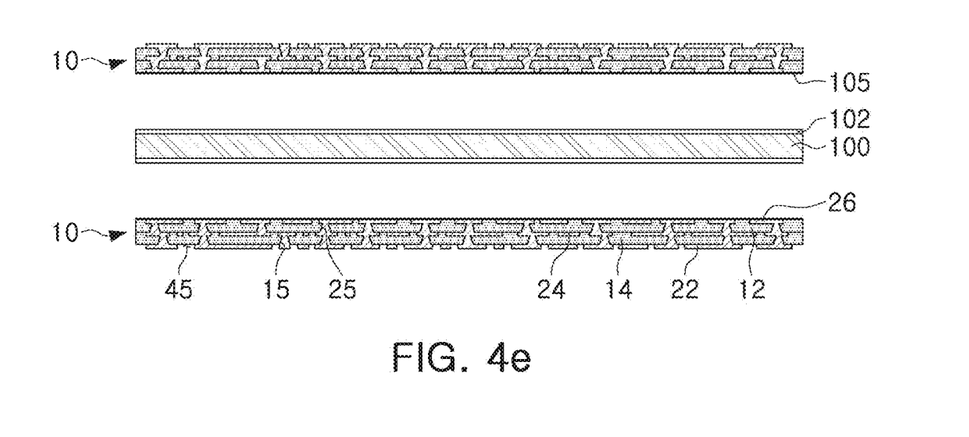
Figure 4F:
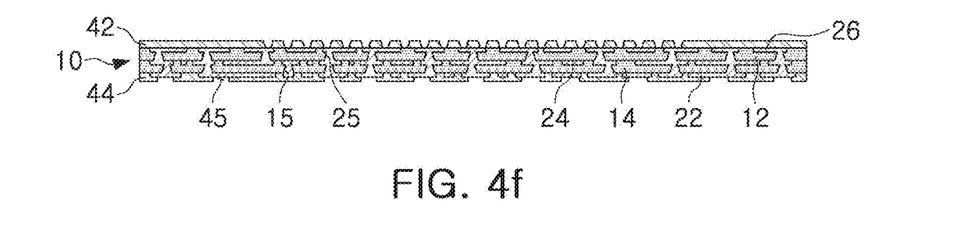

FIG. 4e shows a process of separating the printed circuit board layer, including the built-up insulating layers 12 and 14 and the wiring pattern layers 22, 24 and 26, from the carrier, in which the copper foil layer 105, separated together with the printed circuit board layer 10 when the printed circuit board layer is separated from the carrier, may be removed by etching. FIG. 4f shows a process of applying the solder resists 42 and 44 and forming the hole 45 externally exposing the connection pad 22 or 26.

Printed Circuit Board with Carrier

Figure 5:
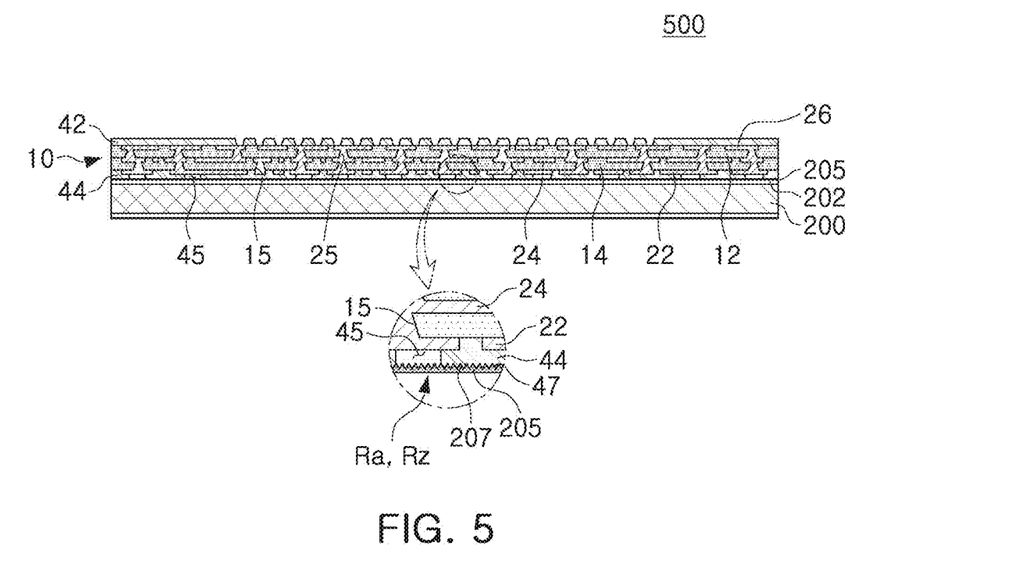
FIG. 5 is a cross-sectional view schematically illustrating a cross-section of a printed circuit board with a carrier according to another exemplary embodiment of the present disclosure.

FIG. 5 is a cross-sectional view schematically illustrating a cross-section of a printed circuit board with a carrier according to another exemplary embodiment of the present disclosure.

A printed circuit board 500 with a carrier according to another exemplary embodiment of the present disclosure may include a printed circuit board layer 10, vias 15 and 25, connection pads 22 and 26, a solder resist 40, and further include a carrier substrate 200.

Descriptions of the printed circuit board layer 10 and the solder resist 40 may be replaced with the above description of the printed circuit board. The carrier substrate 200 may be referred to as a second carrier to be distinguished from the above-described first carrier 100.

The second carrier 200 may include a commercial micro-copper foil and an insulating material. The insulating material may be an insulating material including glass fabric or an insulating resin including no glass fabric, and is not particularly limited. The second carrier 200 may be required to have a copper foil layer 205 that serves to connect a product and the second carrier to each other. The copper foil layer 205 may be a copper foil of 0.3 to 5 μm, and a commercially available micro-copper foil which is a thin copper foil formed on a copper foil of 18 μm as a release layer.

When using JIS B0601-1994, surface roughness of the metal foil portion on a bonding surface may have as an arithmetic average surface roughness Ra of 0.12 to 0.2 μm and a ten (10)-point average surface roughness Rz of 0.6 to 1.3 μm.

Although the printed circuit board layer 10 may have a total thickness of 80 μm or less, the second carrier 200 may be selected to have an adjusted thickness tc in a range of 0.2 to 4.0 times the thickness of the printed circuit board layer 10, thus making it possible for the printed circuit board 500 having such a thickness to be put in/started in a general semiconductor packaging process facility.

As illustrated in FIG. 4f, the printed circuit board layer 10 is first prepared, the solder resist 42 or 44 is applied to its outermost layer, and the hole 45 is formed to externally expose the connection pad 22 or 26.

Figure 6A:
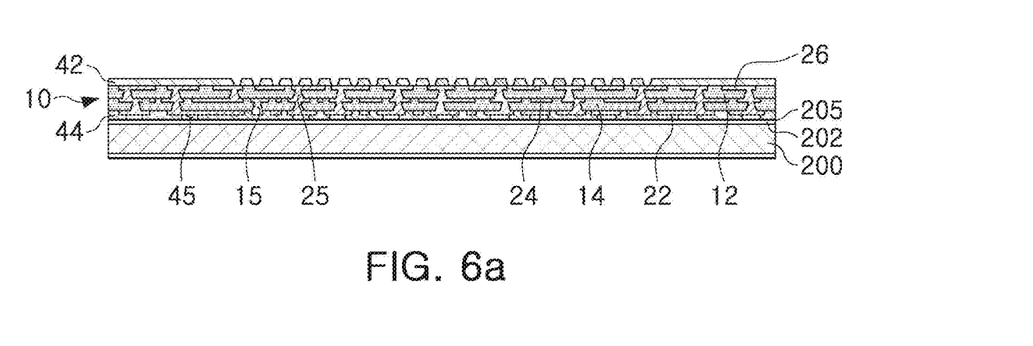
FIGS. 6a through 6d are cross-sectional views respectively illustrating a method for manufacturing a printed circuit board package according to yet another exemplary embodiment of the present disclosure.

FIG. 6a illustrates a process of attaching the carrier 200, on an outermost layer on which the metal foil portion 205 that has a surface-roughness surface, i.e. roughness surface 207 is formed, to an external surface of the solder resist 44 having an adjusted curing degree by adjusting the curing degree of the solder resist 44 formed on one surface of the printed circuit board layer 10.

A ratio tp/tc of the thickness tp of the printed circuit board layer 10 to the thickness tc of the carrier 200 may be in a range of 0.2 to 4.0, and a sum of the thickness tp of the printed circuit board layer 10 and the thickness tc of the carrier 200 may satisfy 80 μm or more.

Here, in order to transfer surface roughness of an external surface of the metal foil portion 205 to the surface of the solder resist 44 as it is, the solder resist 44 may be semi-cured, and the metal foil portion 205 having the surface roughness may then be directly fixedly connected to the solder resist 44 without using an adhesive.

The metal foil portion 205 in contact with the solder resist 44 may have the thickness of 0.3 to 5 μm.

The solder resist 44 in contact with the metal foil portion 205 may include an acrylic component and an epoxy component. Here, the acrylic component may be cured by 81% to 91%, and the epoxy component may be cured by 55% to 75% for the solder resist 44 to have excellent adhesion to the metal foil portion 205 without using the adhesive.

In order to control warpage of the board after attaching the carrier thereto, it is required to maintain a balance between a coefficient of thermal expansion (CTE) of the printed circuit board 1 and the second carrier 200. To this end, a global CTE of the printed circuit board 500 may be 0.8 to 1.1 times a global CTE of the second carrier 200, and the insulating material of the second carrier 200 may have a CTE of 0.8 times or more of a build-up material of the printed circuit board 500. In addition, a CTE of a build-up insulating material included in the printed circuit board (CTEDE_in_PCB) and a CTE of the insulating material included in the carrier (CTEDE_in_Carrier) satisfy a condition of CTEDE_in_PCB/CTEDE_in_Carrier>0.8, thus allowing the warpage of the printed circuit board 500 to be maintained at 5 mm or less.

Warpage of the product to which the carrier is attached occurs within 2 mm when the global CTE of the printed circuit board 500 is 0.8 to 1.1 times the global CTE of the second carrier 200, there is no lifting of a bonding surface after the printed circuit board 500 is reflowed four times at 260° C., and the product illustrates stable adhesion without tearing or lifting of the copper foil attached to the solder resist of the product when the carrier is detached therefrom.

The metal foil portion 205 of the second carrier 200 may be formed on the outermost layer of the second carrier, the external surface of the metal foil portion 205 may include the rough surface 207 on which the surface roughness is formed, and the surface roughness of the external surface of the metal foil portion 205 may be transferred to the surface of the solder resist 44.

The surface-roughness surface of the transferred solder resist 44, that is, the roughness surface 47, may have an arithmetic average surface roughness Ra of 0.12 to 0.2 μm and a ten (10)-point average surface roughness Rz of 0.6 to 1.3 μm.

Here, the roughness surface 47 may have an arithmetic average surface roughness Ra of 0.12 to 0.2 μm and a ten (10)-point average surface roughness Rz of 0.6 to 1.3 μm when using JIS B0601-1994.

First, in order to transfer the roughness of the external surface of the metal foil portion 205 to the surface of the solder resist 44 as it is, the solder resist 44 may be semi-cured, and the metal foil portion 205 having the surface roughness may then be directly fixedly connected to the solder resist 44 without using an adhesive.

Method for Manufacturing Printed Circuit Board Package

FIGS. 6a through 6d are cross-sectional views respectively illustrating a method for manufacturing a printed circuit board package according to yet another exemplary embodiment of the present disclosure.

As shown in FIG. 4f, the method may include preparing a printed circuit board layer 10 first, and applying a solder resist 42 or 44 to its outermost layer, and forming a hole 45 externally exposing a connection pad 22 or 26.

FIG. 6a illustrates a process in which a curing degree of the solder resist 44 formed on one surface of the printed circuit board layer 10 is adjusted, and a carrier 200, on an outermost layer on which a metal foil portion 205 that has a roughness surface, i.e. roughness surface 207 is formed, is thus attached to the solder resist 44 having the adjusted curing degree.

A ratio tp/tc of a thickness tp of the printed circuit board layer 10 to a thickness tc of the carrier 200 may be in a range of 0.2 to 4.0, and a sum of the thickness tp of the printed circuit board layer 10 and the thickness tc of the carrier 200 may satisfy 80 μm or more.

Here, in order to transfer roughness of an external surface of the metal foil portion 205 to a surface of the solder resist 44 as it is, the solder resist 44 may be semi-cured, and the metal foil portion 205 having the surface roughness may then be directly fixedly connected to the solder resist 44 without using an adhesive.

The metal foil portion 205 in contact with the solder resist 44 may have a thickness of 0.3 to 5 μm.

The solder resist 44 in contact with the metal foil portion 205 may include an acrylic component and an epoxy component. Here, the acrylic component may be cured by 81% to 91%, and the epoxy component may be cured by 55% to 75% for the solder resist 44 to have excellent adhesion to the metal foil portion 205 without using the adhesive.

Figure 6B:
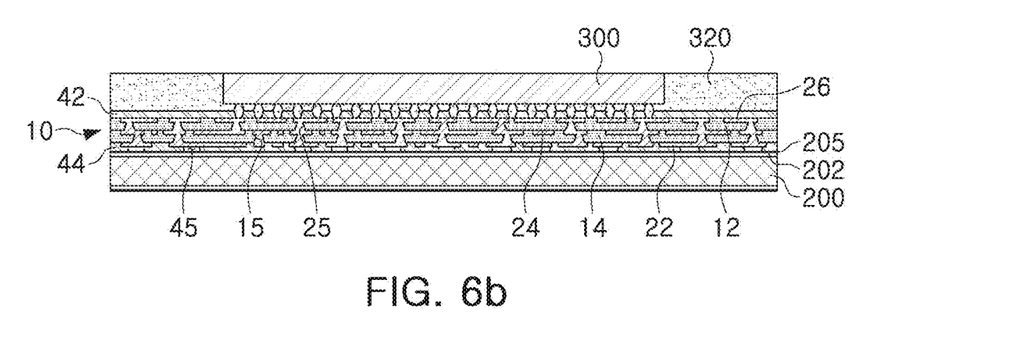

FIG. 6b illustrates a process of mounting and molding a semiconductor chip 300 on the external connection pad 26 exposed to the solder resist 42 formed on the other surface of the printed circuit board layer 10. As in this exemplary embodiment, it is possible to manufacture a package in which the semiconductor chip 300 is mounted on a printed circuit board and then completed by using a molding material 320. It is also possible to manufacture a package in which the semiconductor chip 300 is embedded in a middle of the package, i.e. another printed circuit board is further mounted on the semiconductor chip 300 and the molding material 320, and a hole is then machined and wired in the molding material 320, thereby connecting the printed circuit board and another printed circuit board to each other.

Figure 6C:
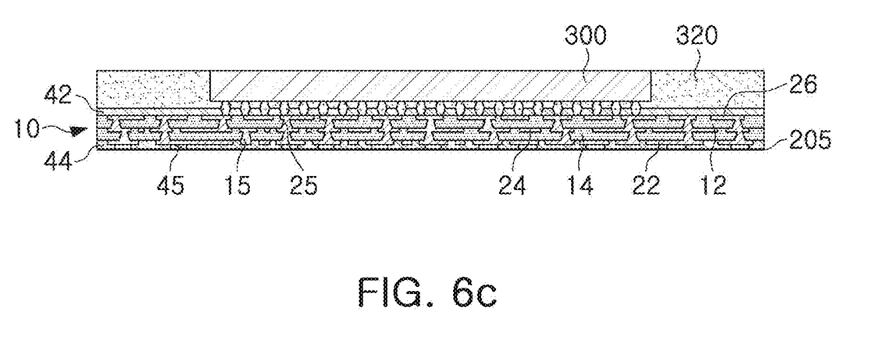

FIG. 6c illustrates a process of separating the board on which the semiconductor chip 300 is mounted from the carrier 200. Here, the metal foil portion 205 may remain on the printed circuit board layer 10.

Figure 6D:
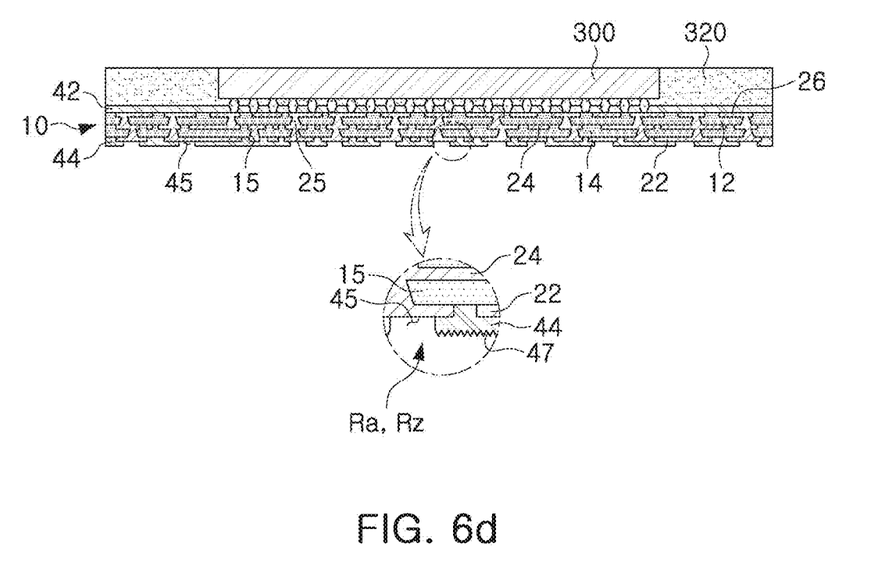

FIG. 6d illustrates a process of exposing the solder resist 44 and the external connection pad 22 by etching the metal foil portion 205 exposed from the separated board 1.

Here, the metal foil portion 205 may be etched to expose an external surface 47 of the solder resist 44 with which the rough surface 207 of the metal foil portion 205 is in contact.

The roughness surface 47 of the solder resist 44, to which the roughness of the metal foil portion 205 is transferred, may have an arithmetic average surface roughness Ra of 0.12 to 0.2 μm, and a ten (10)-point average surface roughness Rz of 0.6 to 1.3 μm.

Here, the roughness surface 47 may have an arithmetic average surface roughness Ra of 0.12 to 0.2 μm, and a ten (10)-point average surface roughness Rz of 0.6 to 1.3 μm when using JIS B0601-1994.

As set forth above, according to the printed circuit board of the present disclosure, it is possible to use even the printed circuit made thin in the semiconductor chip packaging process, and overcome problems occurring when the thin printed circuit board is used in the semiconductor chip packaging process such as the damage or warpage of the board, occurring during its transfer.

According to the printed circuit board with a carrier of the present disclosure, it is possible to manufacturing the thin printed circuit board without tearing or lifting of the copper foil when separating the thin printed circuit board from the carrier although the thin printed circuit board is attached to the carrier used in the semiconductor chip packaging process without using an adhesive.

According to the method for manufacturing a printed circuit board package, it is possible to stably package the semiconductor chip, even using the thin printed circuit board.

While the exemplary embodiments have been shown and described above, it will be apparent to those skilled in the art that modifications and variations could be made without departing from the scope of the present disclosure as defined by the appended claims.

What is claimed is:

1. A printed circuit board comprising:
   a plurality of insulating layers;
   a plurality of lower connection pads disposed at a lower side on a surface of one outermost layer among the plurality of insulating layers;
   a plurality of upper connection pads disposed at an upper side on a surface of another outermost layer among the plurality of insulating layers;
   one or more wiring pattern layers disposed on at least one surface of the plurality of insulating layers and between the plurality of lower connection pads and the plurality of upper connection pads;
   a plurality of via layers respectively disposed in the plurality of insulating layers to connect to the plurality of lower connection pads, the one or more wiring pattern layers, and the plurality of upper connection pads to each other, the plurality of via layers each including one or more vias having a tapered shape tapered in a direction from the lower side to the upper side of the printed circuit board;
   a first solder resist having holes respectively exposing portions of the plurality of lower connection pads; and
   a second solder resist having holes respectively exposing portions of the plurality of upper connection pads,
   wherein at least a central portion of an external surface of the first solder resist has surface roughness greater than surface roughness of a surface of the second solder resist, and
   a pitch of the plurality of lower connection pads opened by the first solder resist is greater than a pitch of the plurality of upper connection pads opened by the second solder resist.

2. The printed circuit board of claim 1, wherein the surface roughness of the first solder resist has an arithmetic average surface roughness Ra of 0.12 to 0.2 μm and a ten (10)-point average surface roughness Rz of 0.6 to 1.3 μm.

3. The printed circuit board of claim 1, wherein a printed circuit board layer including the plurality of insulating layers and the plurality of wiring pattern layers has a total thickness of 80 μm or less.

4. The printed circuit board of claim 1, wherein the first solder resist includes a photosensitive material or a thermosetting material, and includes an acrylic component and an epoxy component.

5. The printed circuit board of claim 1, wherein one of the plurality of insulating layers includes an insulating material including glass or an insulating resin including no glass.

6. A printed circuit board with a carrier, the printed circuit board comprising:
   a printed circuit board layer including:
   a plurality of insulating layers,
   a plurality of lower connection pads disposed at a lower side on a surface of one outermost layer among the plurality of insulating layers, a plurality of connection pads disposed at an upper side on a surface of another outermost layer among the plurality of insulating layers, one or more wiring pattern layers stacked on each other and between the plurality of lower connection pads and the plurality of upper connection pads, and a plurality of via layers respectively disposed in the plurality of insulating layers to connect to the plurality of lower connection pads, the one or more wiring pattern layers, and the plurality of upper connection pads to each other, the plurality of via layers each including one or more vias having a tapered shape tapered in a direction away from the carrier;

a first solder resist having holes respectively exposing portions of the plurality of lower connection pads;

a second solder resist having holes respectively exposing portions of the plurality of upper connection pads; and the carrier on the one outermost layer among the plurality of insulating layers on which a metal foil portion in contact with the first solder resist is disposed, wherein a surface of the metal foil portion and a surface of the first solder resist that are in contact with each other have surface roughness complementary with each other, the surface roughness of the first solder resist is greater than surface roughness of a surface of the second solder resist, and a pitch of the plurality of lower connection pads in contact with the first solder resist is greater than a pitch of the plurality of upper connection pads in contact with the second solder resist.

7. The printed circuit board of claim 6, wherein the metal foil portion in contact with the first solder resist has a thickness of 0.3 to 5 µm.

8. The printed circuit board of claim 7, wherein the surface roughness of the metal foil portion in contact with the first solder resist has an arithmetic average surface roughness Ra of 0.12 to 0.2 µm and a ten (10)-point average surface roughness Rz of 0.6 to 1.3 µm.

9. The printed circuit board of claim 6, wherein a ratio of a thickness of the printed circuit board layer to a thickness of the carrier is in a range of 0.2 to 4.0, and a sum of the thickness of the printed circuit board layer and the thickness of the carrier satisfies 80 µm or more.

10. The printed circuit board of claim 6, wherein the printed circuit board layer has a total thickness of 80 µm or less.

11. The printed circuit board of claim 6, wherein the first solder resist includes a photosensitive material or a thermosetting material, and includes an acrylic component and an epoxy component.

12. The printed circuit board of claim 6, wherein one of the plurality of insulating layers is formed of an insulating material including glass or an insulating resin including no glass.

13. The printed circuit board of claim 6, wherein the surface roughness extends from an edge of one of the holes in the first solder resist.

14. The printed circuit board of claim 1, wherein the surface roughness extends from an edge of one of the holes in the first solder resist.

15. The printed circuit board of claim 6, further comprising a semiconductor chip disposed on the second solder resist to be connected to at least some of the plurality of upper connection pads.

16. The printed circuit board of claim 1, further comprising a semiconductor chip disposed on the second solder resist to be connected to at least some of the plurality of upper connection pads.

17. The printed circuit board of claim 1, wherein in a cross section of the printed board, an entirety of the external surface of the first solder resist has the surface roughness greater than the surface roughness of the surface of the second solder resist.

\* \* \* \* \*